United States Patent [19]

Bethea et al.

[11] Patent Number: 5,023,685

[45] Date of Patent: Jun. 11, 1991

[54] QUANTUM-WELL RADIATION-INTERACTIVE DEVICE, AND METHODS OF RADIATION DETECTION AND MODULATION

[76] Inventors: Clyde G. Bethea, 943 Hillside Ave., Plainfield, N.J. 07062; Ghulam Hasnain, 14 Daphne Ct., Edison, N.J. 08820; Barry F. Levine, 22 Bear Brook La., Livingston, N.J. 07039; Roger J. Malik, 23 Ridgedale Ave., Summit, N.J. 07901

[21] Appl. No.: 361,879

[22] Filed: Jun. 6, 1989

Related U.S. Application Data

[63] Continuation-in-part of Ser. No. 202,860, Jun. 6, 1988, abandoned.

[51] Int. Cl.$^5$ .............................................. H01L 27/14
[52] U.S. Cl. ......................................... 357/30; 357/16
[58] Field of Search ............... 357/30 E, 30 A, 30 M, 357/16, 30 L, 30 B, 30 D

[56] References Cited

U.S. PATENT DOCUMENTS

| | | | |
|---|---|---|---|
| 3,944,812 | 3/1976 | Hattori et al. | 350/96.14 |
| 4,450,463 | 5/1984 | Chin | 357/30 E |
| 4,607,272 | 8/1986 | Osbourn | 357/30 E |
| 4,620,209 | 10/1986 | Parker et al. | 357/30 E |
| 4,711,857 | 12/1987 | Chang | 357/30 E |
| 4,718,947 | 1/1988 | Arya | 357/4 |
| 4,894,526 | 1/1990 | Bethea et al. | 250/211 R |

FOREIGN PATENT DOCUMENTS 0275150  7/1988  European Pat. Off. .......... 357/30 E

OTHER PUBLICATIONS

Dohler, "Solid State Superlattices", Scientific American, Nov. 1983.

*Primary Examiner*—Rolf Hille
*Assistant Examiner*—Minh Loan Tran

[57] ABSTRACT

Electromagnetic radiation such as, in particular, infrared radiation is detected opto-electronically by means of a superlattice structure forming quantum wells having a single bound state; in the interest of minimizing dark-current, relatively wide barriers are used between quantum wells. Resulting highly sensitive, high-speed detectors can be used in optical communications, for terrain mapping, and for infrared viewing. Furthermore, upon application of a variable electrical potential across the superlattice structure, radiation traversing such structure can be modulated.

26 Claims, 6 Drawing Sheets

QUANTUM-WELL RADIATION-INTERACTIVE DEVICE, AND METHODS OF RADIATION DETECTION AND MODULATION

CROSS-REFERENCE TO RELATED APPLICATION

This is a Continuation-in-Part application of patent application Ser. No. 202,860, filed Jun. 6, 1988, now abandoned.

TECHNICAL FIELD

The invention is concerned with radiation-interactive devices whose operation involves excitation of carriers in quantum wells by electromagnetic radiation.

BACKGROUND OF THE INVENTION

While, largely in the context of terrestrial optical communications at currently favored wavelengths in the vicinity of 1 micrometer, devices for the detection and modulation of visible and near-visible electromagnetic radiation have evolved rapidly, the field of infrared devices has remained relatively less well-developed. Practical long-wave infrared detection devices have been based on opto-electronic activity in materials such as mercury-cadmium telluride or doped silicon, quantum-well detectors using compound semiconductor materials having received mostly theoretical attention. Representative reports concerning the latter are cited as follows:

D. D. Coon et al., "New mode of IR Detection Using Quantum Wells", *Applied Physics Letters*, Vol. 45 (1984), pp. 649–651, disclosing infrared radiation detection as based on charge-depletion in localized impurity levels in semiconductors to which an electric field is applied, charge-depletion taking the form of photoemission from a single $Al_xGa_{1-x}As/GaAs/Al_yGa_{1-y}As$ symmetric quantum well;

J. S. Smith et al., "A New Infrared Detector Using Electron Emission from Multiple Quantum Wells", *Journal of Vacuum Science and Technology*, Vol. B1 (1983), pp. 376–378, disclosing the use of a plurality of GaAs/GaAlAs quantum wells from which electrons are ejected upon excitation by free-carrier absorption—see also U.S. Pat. No. 4,620,214, issued Oct. 28, 1986 to S. Margalit et al.; and L. Esaki et al., "New Photoconductor", *IBM Technical Disclosure Bulletin*, Vol. 20 (1977), pp. 2456–2457, disclosing a superlattice structure in which electrons in the lowest sub-band of quantum wells are essentially immobile, while electrons in a second sub-band have significant mobility.

Typically also, proposals have been made as predicated on photonic excitation of electrons from the valence band to the conduction band, the following being cited further as representative in this respect:

U.S. Pat. No. 4,525,731, issued Jun. 25, 1985 to T. I. Chappel et al.; U.S. Pat. No. 4,439,782, issued Mar. 27, 1984 to N. Holonyak; U.S. Pat. No. 4,607,272, issued Aug. 19, 1986 to G. C. Osbourn; U.S. Pat. No. 4,450,463, issued May 22, 1984 to R. Chin; and F. Capasso et al., "New Avalanche Multiplication Phenomenon in Quantum-well Superlattices: Evidence of Impact Ionization Across the Band-edge Discontinuity", *Applied Physics Letters*, Vol. 48 (1986), pp. 1294–1296.

A detector based on the generation of photoelectrons by resonant intersubband absorption and tunneling has been disclosed by B. F. Levine et al., "Quantum-well Avalanche Multiplication Initiated by 10-$\mu$m Intersubband Absorption and Photoexcited Tunneling", *Applied Physics Letters*, Vol. 51 (1987), pp. 934–936. The invention as described below is motivated by the desire to provide for increased efficiency in the collection of photocarriers while, simultaneously, dark-current is kept low.

SUMMARY OF THE INVENTION

The invention is predicated on photonic excitation of carriers in quantum wells having a single bound energy state. In the case of carrier electrons, excitation is from a conduction-band bound energy state into the conduction band continuum; in the case of carrier holes, excitation is from a valence-band bound energy state into the valence band continuum. Collection of carriers in the presence of a bias voltage results in an electrical effect such as, e.g., a change in voltage, current, or resistance. In the interest of providing for a single bound energy state, quantum wells have relatively narrow width and, in the interest of limiting dark-current, barriers are relatively wide. Barrier width in preferred devices is significantly greater than quantum-well width; preferably, barriers are at least three times as wide as quantum wells.

Preferred radiation detectors include a plurality of quantum wells as realized by means of a semiconductor superlattice, i.e., layered structure in which interleaved layers serve as quantum-well and barrier layers. For example, a superlattice can be made as a heterostructure in which quantum-well and barrier layers are made of different materials; also, superlattice structure can be produced in a homogeneous material by periodically varying doping levels. Peak absorption wavelength depends on the choice of materials, and devices of the invention can be designed for infrared absorption at preferred wavelengths from 3 to 15 $\mu$m, longer as well as shorter wavelengths not being precluded.

Preferred devices of the invention have high-speed capability and are suitable for use in heterodyne receivers. Such devices can be used in optical communications and especially in outer space, e.g., between satellites. Also, infrared radiation detection in accordance with a preferred embodiment of the invention can be used for terrain mapping and infrared viewing.

In accordance with yet another preferred embodiment, disclosed quantum-well structures can serve as light modulators.

DETAILED DESCRIPTION

Figure 1:
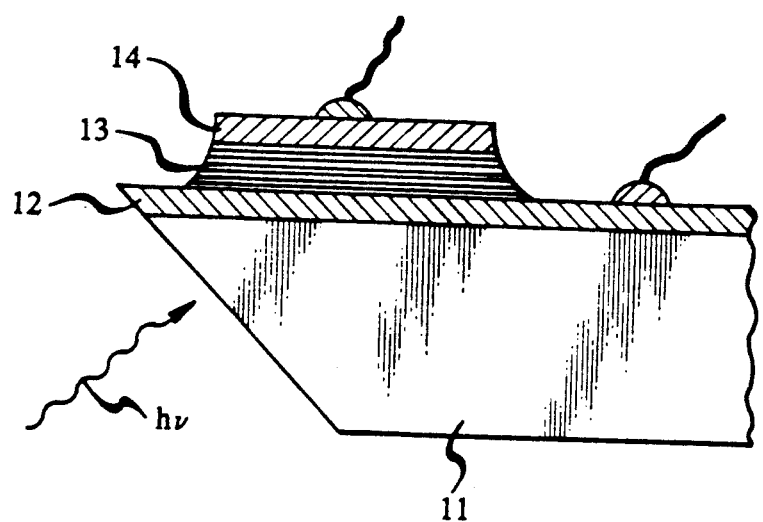
FIG. 1 is a schematic side view of a radiation detector in accordance with a first preferred embodiment of the invention.

FIG. 1 shows substrate 11 having an angled face adapted for incident radiation $h\nu$. Substrate 11 supports a first contact layer 12, interleaved first and second semiconductor layers forming superlattice 13, and second contact layer 14. When a bias voltage is applied to contact layers 12 and 14, electrical current between such contacts is directly related to the intensity of radiation $h\nu$.

Figure 2:
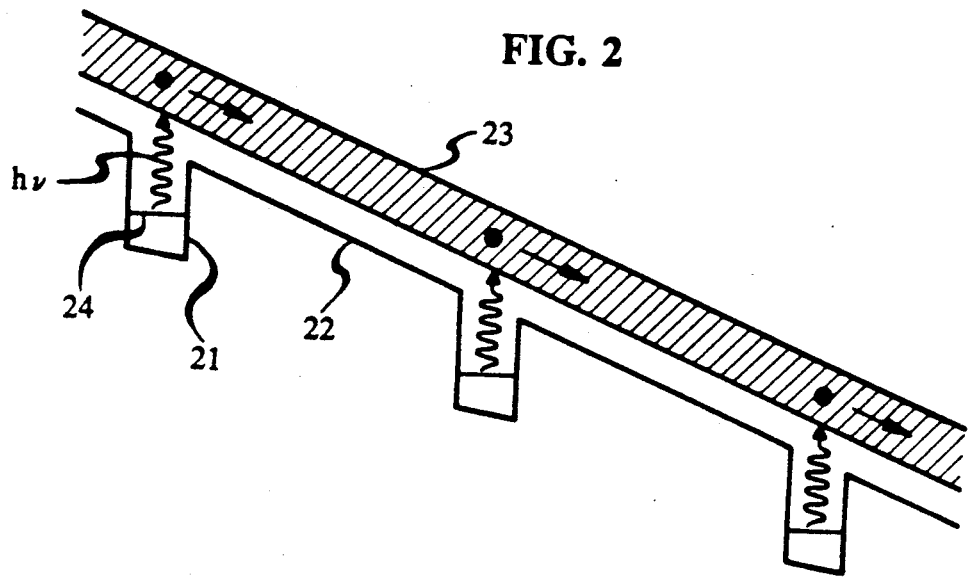
FIG. 2 is a schematic energy band diagram corresponding to the radiation detector of FIG. 1 as electrically biased, and as implemented using a semiconductor heterostructure.

FIG. 2 shows quantum wells 21 between barriers 22 as corresponding to first and second semiconductor layers forming superlattice 13 of FIG. 1. There is a single bound energy state 24 for carriers (electrons, holes) in quantum wells 21, and barrier height is chosen such that incident radiation $h\nu$ of interest excites bound carriers into the continuum energy band 23. In the interest of limiting dark-current, barriers are significantly wider than wells.

Figure 3:
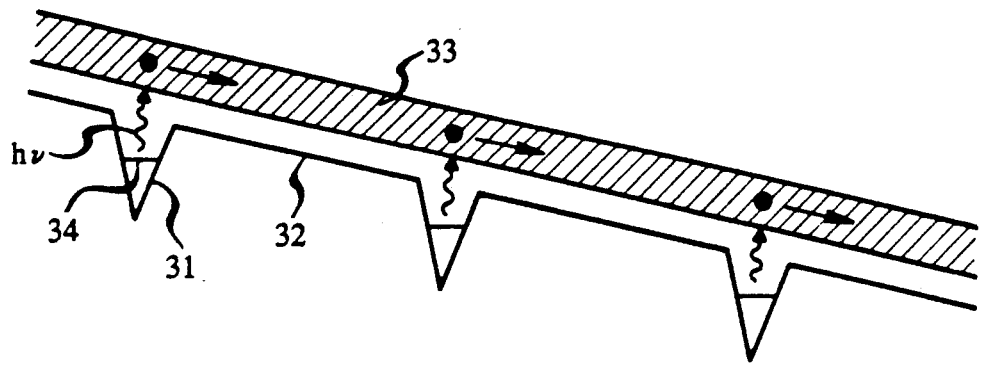
FIG. 3 is a schematic energy band diagram as corresponding to the radiation detector of FIG. 1 as electrically biased, and as implemented using a semiconductor homostructure in which quantum wells are formed by doped regions.

FIG. 3 shows V-shaped quantum wells 31 between barriers 32 as produced by locally heavy dopant concentrations ("spikes") in an otherwise essentially homogeneous semiconductor material. There is a single bound energy state 34 for carriers in quantum wells 31, and barrier height is chosen such that incident radiation $h\nu$ of interest excites bound carriers into the continuum energy band 33. Again, barriers are relatively wide, the width of quantum wells and of barriers conveniently being defined as measured at the level of the bound energy state. Other well profiles such as, e.g., square and trapezoidal shapes are not precluded.

Figure 4:
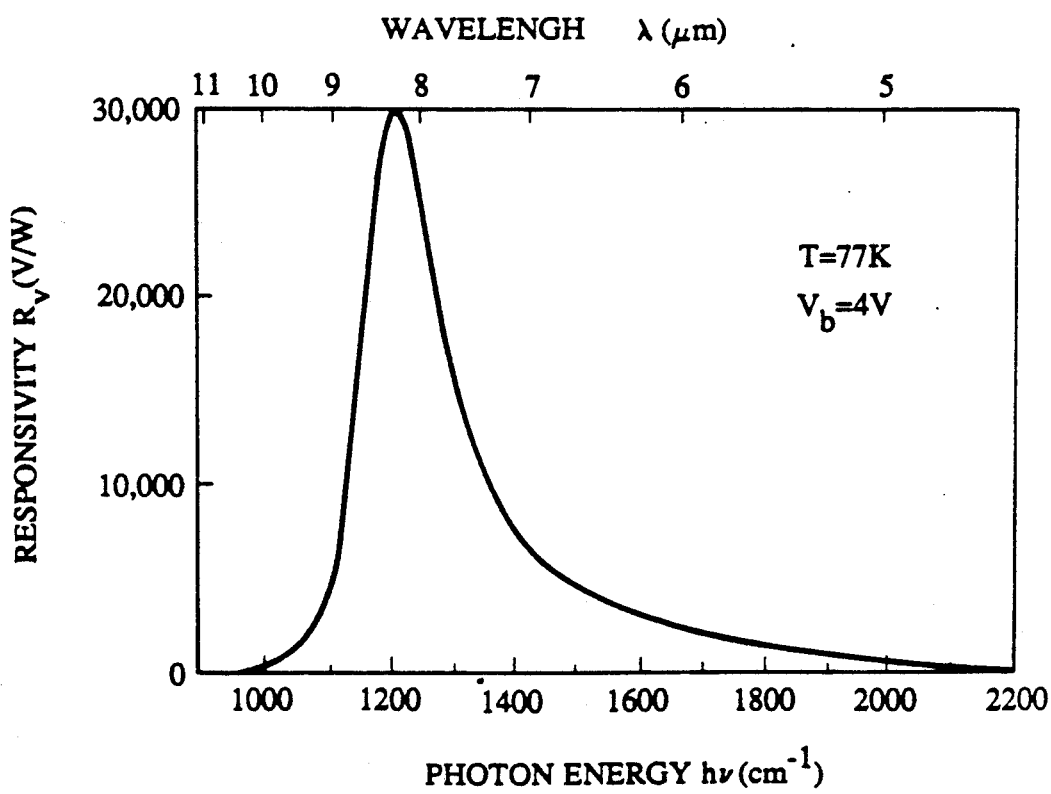
FIG. 4 is a diagram which graphically shows responsivity as a function of photon energy incident on a device as depicted in FIG. 1.

FIG. 4 shows, along the horizontal axis, photon energy $h\nu$ in units of $cm^{-1}$ (or wavelength $\lambda$ in units of $\mu m$) and, along the vertical axis, responsivity $R_\nu$ in units of V/W). The graph is based on measurements made at a temperature of 77K and with a bias voltage of 4 V across a 50-period superlattice of interleaved layers of gallium arsenide and aluminum gallium arsenide as further described in Example 1 below.

Figure 5:
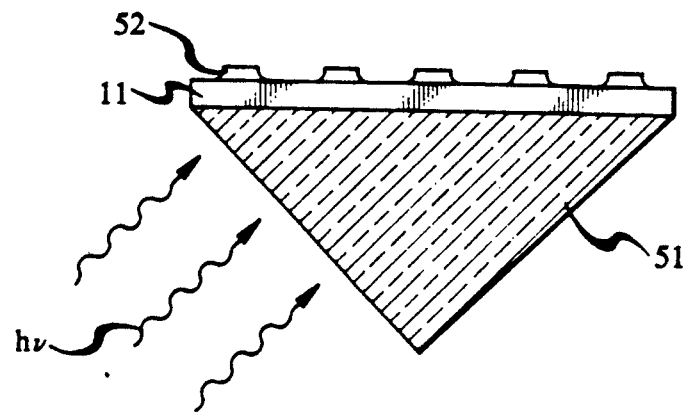
FIG. 5 is a schematic side view of an array of radiation detectors in accordance with a second preferred embodiment of the invention.

FIG. 5 shows prism 51 attached to (transparent) substrate 11 as adapted for coupling of incident radiation $h\nu$ to detectors 52, each such detector being as depicted in FIG. 1. A preferred radiation coupler serves to direct radiation such that the electric field vector of electromagnetic radiation incident on the superlattice has a component perpendicular to the superlattice. Such coupling function may alternatively be performed by a grating.

Figure 6:
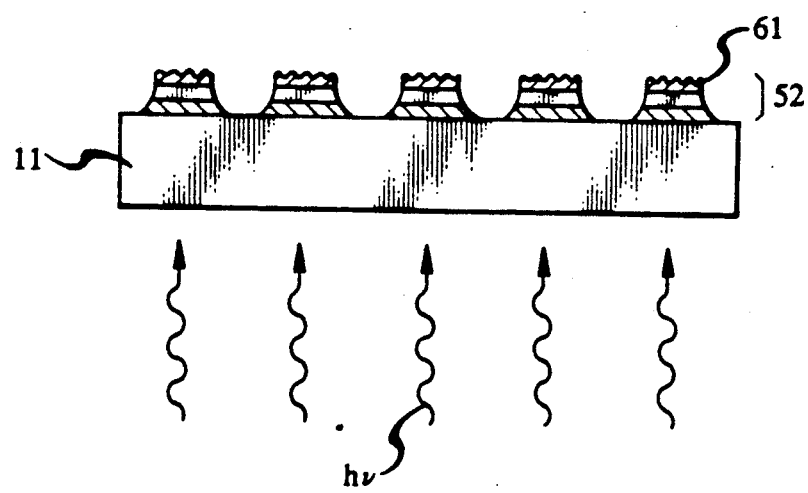
FIG. 6 is a schematic side view of an array of radiation detectors including reflective radiation coupling means in accordance with a third preferred embodiment of the invention.

FIG. 6 shows detectors 52 on (transparent) substrate 11, incident radiation $h\nu$ being coupled to detectors 52 by means of reflector gratings 61. A detector array as depicted (and as understood in two dimensions) can serve, e.g., as a focal-plane medium in a camera. Instead of gratings, diffusely scattering (roughened) surfaces can be used for coupling.

Figure 7:
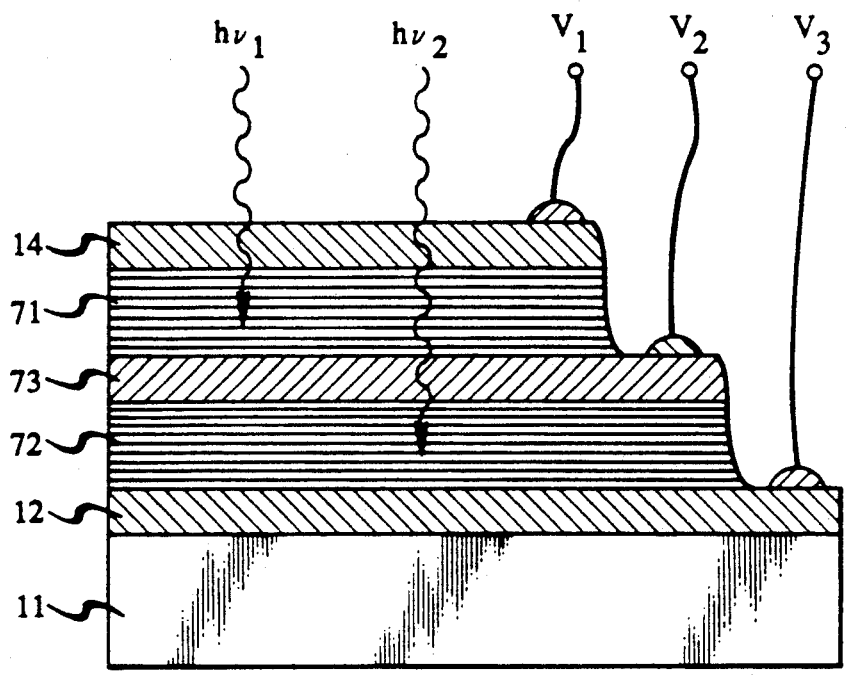
FIG. 7 is a schematic side view of a two-wavelength detector in accordance with a fourth preferred embodiment of the invention.

FIG. 7 shows two superlattices 71 and 72 with respective contacts 14 and 73 as supported by substrate 11 with contact 12. Superlattices 71 and 72 are made from different materials as chosen to result in absorption at different wavelengths of interest. Incident radiation components $h\nu_1$ and $h\nu_2$ of interest are shown as being absorbed by respective superlattices 71 and 72 and as producing voltages $V_1$ and $V_2$. While, for the sake of simplicity, radiation is shown incident perpendicular to the superlattice in FIG. 7, optical coupling preferably takes one of the forms as shown in FIG. 1, 5, and 6. A stack arrangement as depicted in FIG. 7 can serve as a spectrometer; alternatively, by omission of contact layer 73, a broadened spectral response can be obtained between contacts 12 and 14. To achieve broadened or otherwise tailored spectral response, grouping together of like quantum wells is not actually required so long as different quantum wells are present in appropriate numbers between contacts 12 and 14. Conversely, for applications requiring high wavelength selectivity, high uniformity of quantum wells is preferred.

By combining stack arrangements according to FIG. 7 into arrays according to FIG. 6, a color camera can be realized. A color camera can be realized also without stacked sensors, in which case detectors having peak sensitivity at different wavelengths are arranged into a focal-plane array, e.g., in periodically alternating fashion.

Figure 8:
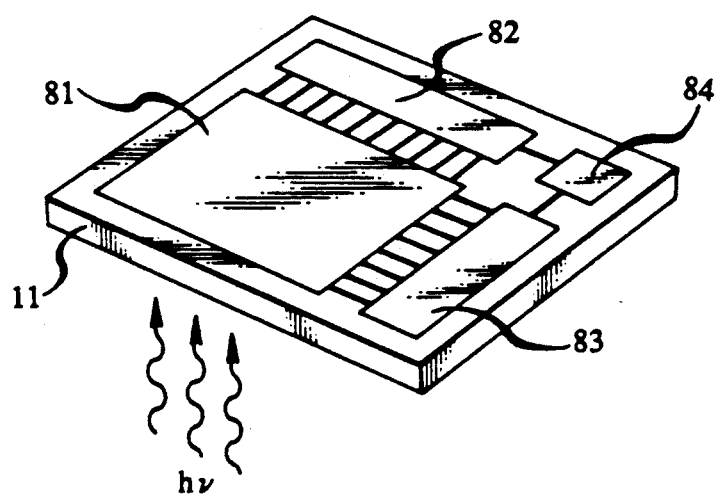
FIG. 8 is a schematic perspective view of a monolithically integrated device in accordance with a fifth preferred embodiment of the invention.

Preferably, a detector array is monolithically integrated with associated electronics on a common substrate as illustrated by FIG. 8 which shows detector array 81 on substrate 11, array 81 comprising a two-dimensional arrangement of detectors, e.g., in accordance with FIG. 6. The detectors are electrically connected to row-processing electronics 82 and column-processing electronics 83 which, together with image-processing unit 84, are also situated on substrate 11.

A superlattice detector structure may be realized by interleaved first and second layers of suitable Group IV, Group III-V, or Group II-VI materials. In one preferred embodiment Group IV materials are used, quantum wells are p-doped, and device operation involves excitation of valence-band carriers. Another preferred embodiment, involving excitation of conduction-band electrons, is based on the use of Group III-V or Group II-VI materials with n-doped quantum wells. Other doping arrangements are not precluded.

Readily suitable for detection at wavelengths in the "atmospheric window" from 8 to 14 μm are heterostructure devices having gallium arsenide quantum-well layers and aluminum-gallium arsenide barrier layers. For the detection of 10-μm radiation, preferred quantum-well width does not exceed 65 Angstroms, and preferred barrier width is at least 200 Angstroms. Other typical Group III-V material systems include combinations of aluminum-indium arsenide and indium-gallium arsenide, and of indium phosphide, indium-gallium arsenide, and indium-gallium arsenide-phosphide.

Further, in the interest of maintaining acceptably low dark-current, doping of n-type devices preferably is less than $5 \times 10^{18}$ cm$^{-3}$ similarly, doping of p-type devices preferably is less than $5 \times 10^{19}$ cm$^{-3}$. Dark current further depends on the shape of barriers which may be square, stepped, or graded (e.g., linearly or parabolic), and barrier shape also has an influence on the ease with which excited carriers are transported and collected.

Device manufacture typically involves superlattice fabrication on a substrate under highly controlled conditions as realized, e.g., in molecular-beam epitaxy (MBE) or in metal-organic chemical vapor deposition (MOCVD). Such fabrication technologies are as reviewed, e.g., by A. Y. Cho, "Recent Developments in III-V Compound Semiconductor Materials and Devices", in: J. D. Chadi et al., ed., *Proceedings of the 17th International Conference on the Physics of Semiconductors*, Springer-Verlag, 1985, pp. 1515-1524; and by R. D. Dupuis, "Metal-organic Chemical Vapor Deposition of III-V Semiconductors", *Science*, Vol. 226 (1984), pp. 623-629.

Among advantages of detectors of the invention (e.g., as compared with mercury-cadmium telluride detectors) are the following:

(i) ready availability of suitable, large-size, high-quality, inexpensive substrates;

(ii) availability of well-developed Group III-V and Group IV growth, processing, and passivation technologies, especially as including molecular-beam epitaxial (MBE) deposition with high uniformity, reproducibility, and compositional control over substrates 0.3 inches in diameter or larger.

(iii) potential of monolithic integration with silicon and gallium-arsenide devices such as, e.g., field-effect transistors (FET), charge-coupled devices (CCD), and high-speed signal processing electronics;

(iv) ease of tailoring of the absorption characteristics by means of choice of composition, e.g., to vary the peak absorption wavelength over the atmospheric window; and (v) superior thermal stability.

Figure 9:
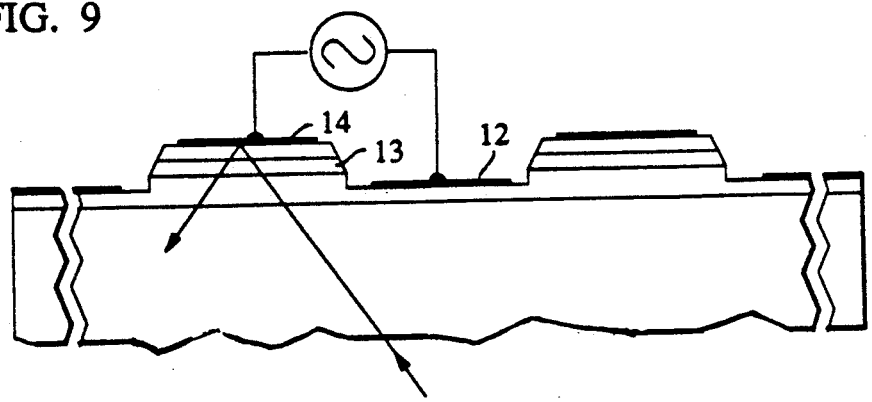
FIG. 9 is a schematic side view of a radiation-interactive device including a variable voltage source, as well as a grating for optical coupling through the substrate in accordance with further preferred embodiments of the invention.
Figure 10:
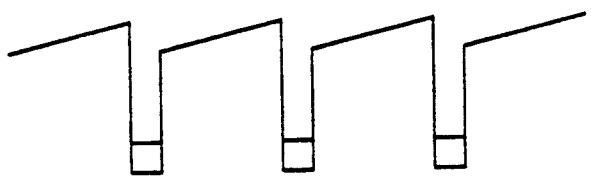
FIGS. 10-12 are schematic energy band diagrams corresponding to a preferred radiation detector or radiation modulator device of the invention in which barrier layers in a semiconductor heterostructure have graded composition, FIG. 10 corresponding to zero bias, FIG. 11 corresponding to forward bias, and FIG. 12 corresponding to reverse bias.
Figure 11:
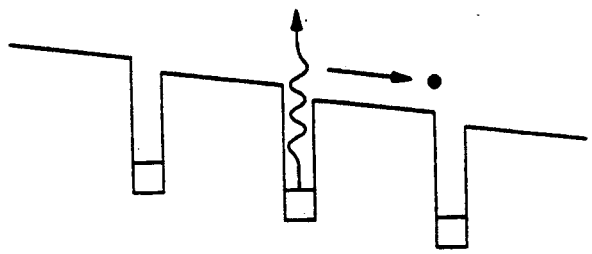
Figure 12:
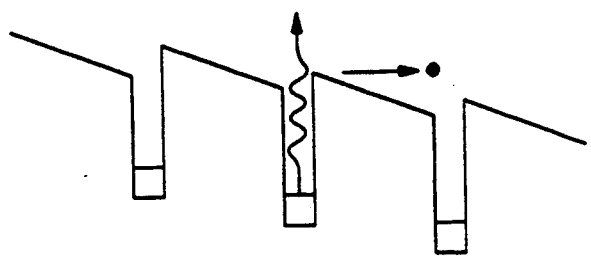
Figure 13:
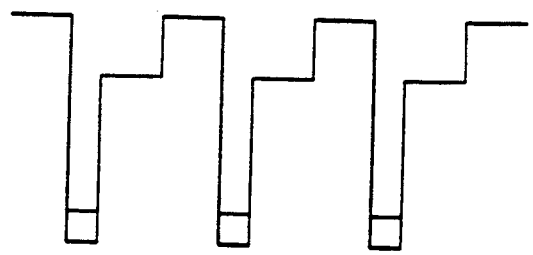
FIG. 13 is a schematic energy band diagram of an alternate preferred detector or modulator structure in which barrier layers have a stepped asymmetrical energy profile.

Further with respect to quantum-well structures as described above, on account of newly discovered negative differential photoconductance, such structures can serve to modulate light. For example, upon application of a variable voltage between contacts 12 and 14 in a device as shown in FIG. 9, the intensity of light transmitted by structure 13 is modulated in response to such voltage. Preferably, for modulator application, barriers have asymmetrical energy band profiles, including gradually changing or stepped profiles—see, respectively, FIG. 10-11 and FIG. 12. Asymmetrical profiles can also be used to advantage in detector applications, e.g., for electrically controlling or tuning a detector device with respect to wavelength corresponding to peak responsivity, and/or with respect to bandwidth. In particular, tuning can be used for real-time electrical control of an imaging detector array, thereby providing control over image quality.

FIG. 9 further illustrates coupling of light into a substrate-supported quantum-well structure by means of a grating on the substrate. As compared with the arrangement of FIG. 6, this arrangement results in physical separation of optical coupling and electrical contact structures, as may be preferred for the sake of ease of manufacture. The use of gratings on both sides of the detector structure is not precluded.

The following Examples illustrate device structure and performance as realized with a superlattice of interleaved gallium arsenide/aluminum-gallium arsenide layers. All numerical values are nominal or approximate.

EXAMPLE 1

On a semi-insulating gallium arsenide substrate, a 1-μm contact layer of gallium arsenide was deposited (doped n=$2 \times 10^{18}$ cm$^{-3}$), followed by a superlattice detector structure consisting of 50 periods of 40-Angstrom gallium arsenide quantum well layers (doped n=$2 \times 10^{18}$ cm$^{-3}$) and 300-Angstrom Al$_{0.31}$Ga$_{0.69}$As undoped barrier layers (resulting in a barrier height of approximately 250 mV). A top contact layer of 0.5 μm gallium arsenide was deposited, doped n=$2 \times 10^{18}$ cm$^{-3}$, a mesa having a diameter of 200 μm was produced by standard photolithographic processing, and contact metallizations were provided by evaporation.

For the measurement of the spectral dependence of the responsivity $R_\nu$, a glowbar infrared source was used; detector temperature was 77K, bias voltage was 4 V, and load resistance was 100 kΩ. As can be seen from FIG. 4, the response is peaked at $h\nu = 1192$ cm$^{-1}$ and has a narrow spectral width of $\Delta h\nu = 155$ cm$^{-1}$ (i.e., $\Delta \nu/\nu = 13\%$). Dark current was found to be 4.5 μA.

For a determination of detectivity, the detector noise was measured under the same conditions by means of a spectrum analyser, and the noise voltage per unit bandwidth was found to be 50 nV Hz$^{-\frac{1}{2}}$ at an optical chopping frequency of 4 kHz, corresponding to a noise-equivalent-power of 1.7 pW Hz$^{-\frac{1}{2}}$. Upon normalization by the device area the detectivity is obtained as $D^* = 1.0 \times 10^{10}$ cm Hz$^{\frac{1}{2}}$/W.

The speed of the detector was measured by means of radiation from a pulsed diode laser and a 50-Ω load resistor. The observed response time of 5 ns was circuit-limited, assuring device capability in the multi-gigahertz range.

EXAMPLE 2

Figure 14:
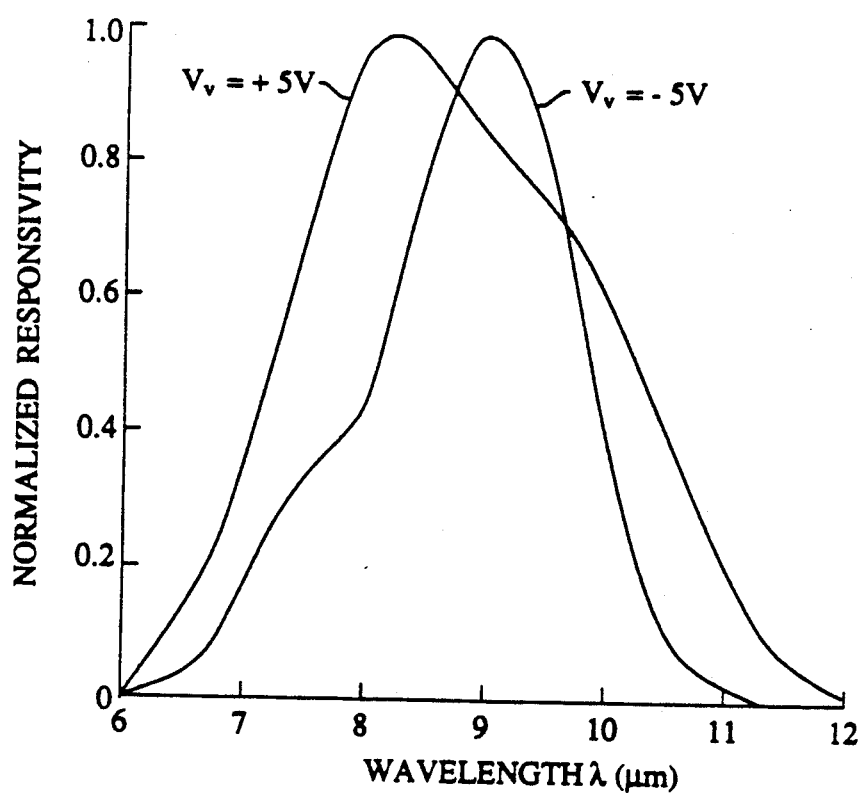
FIG. 14 is a diagram which graphically shows responsivity as a function of photon energy incident on an experimental detector device which comprises a heterostructure having energy band diagrams as shown in FIG. 11 and 12.

A device was made as described in Example 1 above, except that barrier layer composition Al$_x$Ga$_{1-x}$As was graded linearly from x=0.25 to x=0.30. Device responsivity, measured at a temperature of 20K, is graphically shown in FIG. 14 for bias voltages of +5 V (forward bias) and −5 V (reverse bias). It is apparent that device response is bias-dependent with respect to the wavelength of peak responsivity, as well as with respect to bandwidth.

We claim:

1. A device responsive to electromagnetic radiation at a wavelength of interest comprising a substrate-supported semiconductor superlattice between contact layers, said superlattice comprising interleaved quantum-well and barrier layers, quantum wells formed by said layers respectively having a thickness of less than about 65 Angstroms so as to have one and only one conduction-band bound energy state;

said quantum wells being adapted for carrier excitation by said electromagnetic radiation from said conduction-band bound energy state into a conduction-band continuum energy state, and the thickness of said barrier layers being significantly greater than the thickness of said quantum-well layers.

2. The device of claim 1, comprising means for sensing an electrical signal between said contact layers.

3. The device of claim 2, comprising a plurality of superlattices.

4. The device of claim 3, said plurality forming an array.

5. The device of claim 4, said plurality comprising said superlattices as corresponding to different wavelengths of interest.

6. The device of claim 3, said plurality forming a stack comprising said detectors as corresponding to different wavelengths of interest.

7. The device of claim 1, comprising means for applying an electrical signal between said contact layers.

8. The device of claim 1, the thickness of said barrier layers being greater than or equal to three times the thickness of said quantum-well layers.

9. The device of claim 1, said wavelength being greater than or equal to 3 $\mu$m.

10. The device of claim 9, said wavelength being in the range from 3 to 15 $\mu$m.

11. The device of claim 1, said superlattice comprising interleaved layers of different materials.

12. The device of claim 11, said superlattice comprising Group III–V semiconductor materials, and said quantum-well layers being n-doped.

13. The device of claim 12 in which said semiconductor materials are selected from the group consisting of gallium arsenide, aluminum-gallium arsenide, aluminum-indium arsenide, indium-gallium arsenide, indium phosphide, and indium-gallium arsenide-phosphide.

14. The device of claim 12, said materials being gallium arsenide and aluminum-gallium arsenide, said quantum-well layers having a thickness which is less than or equal to 65 Angstroms, said barrier layers having a thickness which is greater than or equal to 100 Angstroms, and said wavelength being about 10 $\mu$m.

15. The device of claim 1, further comprising radiation coupler means for directing said radiation to said superlattice.

16. The device of claim 15, wherein said coupler comprises prism means for directing said radiation to said superlattice.

17. The device of claim 15, wherein said coupler comprises grating means for directing said radiation to said superlattice.

18. The device of claim 17, said grating being on the substrate which supports said superlattice.

19. The device of claim 15, wherein said coupler comprises reflector means for directing said radiation to said superlattice.

20. The device of claim 19, said reflector being adapted for diffuse scattering of radiation.

21. A method for detecting electromagnetic radiation at a wavelength of interest, said method comprising
making said radiation incident on a substrate-supported semiconductor superlattice between contact layers, said superlattice comprising interleaved quantum-well and barrier layers, quantum wells formed by said layers respectively having a thickness of less than about 65 Angstroms so as to have one and only one conduction-band bound energy state, said quantum wells being adapted for carrier excitation by said electromagnetic radiation from said conduction-band bound energy state into a conduction-band continuum energy state, the thickness of said barrier layers being significantly greater than the thickness of said quantum-well layers, and sensing an electrical signal between said contact layers.

22. A method for modulating electromagnetic radiation at a wavelength of interest, said method comprising
making said radiation incident on a substrate-supported semiconductor superlattice between contact layers, said superlattice comprising interleaved quantum-well and barrier layers, quantum wells formed by said layers respectively having a thickness of less than about 65 Angstroms so as to have one and only one conduction-band bound energy state, said quantum wells being adapted for carrier excitation by said electromagnetic radiation from said conduction-band bound energy state into a conduction-band continuum energy state, the thickness of said barrier layers being significantly greater than the thickness of said quantum-well layers, and applying an electrical signal between said contact layers.

23. A device responsive to electromagnetic radiation at a wavelength of interest comprising a substrate-supported semiconductor superlattice between contact layers, said superlattice comprising semiconductor layers forming interleaved quantum-wells and barrier layers; said quantum wells formed by said layers respectively having a thickness of less than about 65 Angstroms so as to have one and only one valence-band bound energy state;

said quantum wells being adapted for carrier excitation by said electromagnetic radiation from said valence-band bound energy state into a valence-band continuum energy state; and the thickness of said barrier layers being significantly greater than the thickness of said quantum-well layers.

24. The device of claim 23, said superlattice comprising Group IV semiconductor materials, and said quantum-well layers being p-doped.

25. A method for detecting electromagnetic radiation at a wavelength of interest, said method comprising:
making said radiation incident on a substrate-supported semiconductor superlattice between contact layers, said superlattice comprising interleaved quantum-well and barrier layers, said quantum wells formed by said layers respectively having a thickness of less than about 65 Angstroms so as to have one and only one valence-band bound energy state, said quantum wells being adapted for carrier excitation by said electromagnetic radiation from said valence-band bound energy state into a valence band continuum energy state, the thickness of said barrier layers being significantly greater than the thickness of said quantum well layers, and sensing an electrical signal between said contact layers.

26. A method for modulating electromagnetic radiation at a wavelength of interest, said method comprising making said radiation incident on a substrate-supported semiconductor superlattice between contact layers, said superlattice comprising interleaved quantum-well and barrier layers, quantum wells formed by said layers respectively having a thickness of less than about 65 Angstroms so as to have one and only one valence-band bound energy state, said quantum wells being adapted for carrier excitation by said electromagnetic radiation from said valence-band bound energy state into a valence-band continuum energy state, the thickness of said barrier layers being significantly greater than the thickness of said quantum-well layers, and applying an electrical signal between said contact layers.

* * * * *

UNITED STATES PATENT AND TRADEMARK OFFICE
CERTIFICATE OF CORRECTION

PATENT NO. : 5,023,685

DATED : June 11, 1991

INVENTOR(S) : Clyde G. Bethea, Ghulam Hasnain, Barry F. Levine and Roger J. Malik It is certified that error appears in the above-identified patent and that said Letters Patent is hereby corrected as shown below:

On the title page, pease add:

--Bell Telephone Laboratories, Incorporated, Murray Hill, N.J. & American Telephone and Telegraph Company, New York, NY--.

Signed and Sealed this

Fifth Day of January, 1993

*Attest:*

DOUGLAS B. COMER

*Attesting Officer*  Acting Commissioner of Patents and Trademarks